(12) United States Patent
Ishizaka

(10) Patent No.: US 7,422,636 B2
(45) Date of Patent: Sep. 9, 2008

(54) PLASMA ENHANCED ATOMIC LAYER DEPOSITION SYSTEM HAVING REDUCED CONTAMINATION

(75) Inventor: Tadahiro Ishizaka, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 362 days.

(21) Appl. No.: 11/090,939

(22) Filed: Mar. 25, 2005

(65) Prior Publication Data

US 2006/0213439 A1    Sep. 28, 2006

(51) Int. Cl.
- C23C 16/505  (2006.01)
- C23C 16/509  (2006.01)
- C23C 16/06   (2006.01)

(52) U.S. Cl. ........................ 118/719; 118/666; 118/663; 118/729

(58) Field of Classification Search ................. 118/719, 118/666, 663, 729
See application file for complete search history.

(56) References Cited

U.S. PATENT DOCUMENTS

| | | | |
|---|---|---|---|
| 4,816,638 A | 3/1989 | Ukai et al. | |
| 5,024,716 A | 6/1991 | Sato | |
| 5,314,574 A | 5/1994 | Takahashi | |
| 6,183,564 B1 * | 2/2001 | Reynolds et al. | 118/719 |
| 6,221,781 B1 | 4/2001 | Siefering et al. | |
| 6,409,837 B1 | 6/2002 | Hillman | |
| 6,663,714 B2 * | 12/2003 | Mizuno et al. | 118/719 |
| 2001/0042514 A1 | 11/2001 | Mizuno et al. | |
| 2004/0134611 A1 * | 7/2004 | Kato et al. | 156/345.33 |
| 2004/0224505 A1 | 11/2004 | Nguyen et al. | |
| 2005/0269030 A1 * | 12/2005 | Kent et al. | 156/345.31 |

FOREIGN PATENT DOCUMENTS

| | | |
|---|---|---|
| EP | 0698915 A1 | 2/1996 |
| EP | 1182695 A2 | 2/2002 |

OTHER PUBLICATIONS

EPO, International Search Report and Written Opinion of the International Searching Authority, International Application No. PCT/US2006/009984, Mailed on Aug. 3, 2006 (15 pages).

* cited by examiner

*Primary Examiner*—Rudy Zervigon
(74) *Attorney, Agent, or Firm*—Wood, Herron & Evans, L.L.P.

(57) ABSTRACT

A plasma enhanced atomic layer deposition (PEALD) system is described, wherein the system comprises a processing space and a high vacuum, ultra-clean transfer space. During processing, the substrate to which the thin conformal film is formed is exposed to the processing space. During substrate transfer, the substrate is exposed to the high vacuum space. Processing gases are introduced sequentially and alternately to the process chamber and the pressures and gas flows within, to and from, and between the process chamber and the high vacuum transfer space are controlled to keep the transfer space ultra-clean.

21 Claims, 7 Drawing Sheets

PLASMA ENHANCED ATOMIC LAYER DEPOSITION SYSTEM HAVING REDUCED CONTAMINATION

BACKGROUND OF THE INVENTION

1. Field of the Invention

The present invention relates to a plasma enhanced atomic layer deposition, and more particularly to a plasma enhanced atomic layer deposition system configured for reduced contamination and a method of operating the system.

2. Description of Related Art

Typically, during materials processing, when fabricating composite material structures, plasma is employed to facilitate the addition and removal of material films. For example, in semiconductor processing, a dry plasma etch process is often utilized to remove or etch material along fine lines or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of PECVD or more generally CVD, has emerged as a candidate for ultra-thin gate film formation in front end-of-line (FEOL) operations, as well as ultra-thin barrier layer and seed layer formation for metallization in back end-of-line (BEOL) operations. In ALD, two or more process gases are introduced alternatingly and sequentially in order to form a material film one monolayer at a time. Such an ALD process has proven to provide improved uniformity in layer thickness and conformality to features on which the layer is deposited.

CVD processes are generally regarded as "dirty" processes compared to PVD processes. CVD processes employ gases that are typically capable of forming deposits on various surfaces within a processing chamber and of escaping into adjacent passages and chambers, such as transport and adjacent processing chambers, to form deposits there. These deposits can flake off forming particulate contamination and can out-gas into the vacuum spaces to deposit elsewhere, including on wafers resting in or passing through those spaces. Such deposits can include films of the type being deposited on the wafer as well as deposits of other compounds formed by the CVD gases as a result of gas compositions, temperatures, energy levels and other factors existing at the surfaces of the various chamber components.

The problem of CVD gases escaping into adjacent chambers has been addressed by applicant's assignee in related U.S. Pat. No. 6,183,564, in which a buffer chamber is disclosed below a processing chamber in a CVD processing module. The buffer chamber is capable of being sealed from the processing chamber and is situated between the processing chamber and a transfer chamber so that the wafers pass through the buffer chamber when entering and leaving the process chamber. Dirty gases escaping from the processing chamber are trapped in and purged from the buffer chamber, thereby minimizing their contamination of the transfer chamber and chambers beyond.

With or without the use of the buffer chamber, after being processed, contaminants are found on wafers processed in the chamber. As features become smaller and films become thinner, this form of contamination is an increasing problem.

SUMMARY OF THE INVENTION

In accordance with certain principles of the present invention, a plasma enhanced atomic layer deposition (PEALD) system and a method of operating thereof is provided.

In an embodiment of the present invention, a method and system is provided for reducing contamination in a plasma enhanced atomic layer deposition (PEALD) system.

According to another embodiment, a deposition system for forming a thin film on a substrate is described comprising: a processing chamber comprising a process space in an upper region of the processing chamber configured to facilitate the thin film deposition, and a transfer space in a lower region of the processing chamber configured to facilitate transfer of the substrate into and out of the processing chamber; a substrate holder coupled to the processing chamber and configured to support the substrate, and configured to translate vertically between a first position to locate the substrate in the transfer space and a second position to locate the substrate in the process space, wherein the substrate holder comprises a sealing device configured to seal the substrate holder with the processing chamber when the substrate holder is in the second position; a first pressure control system coupled to the transfer space and configured to provide a substantially contaminant-free environment in the transfer space; a second pressure control system coupled to the process space and configured to evacuate the process space during processing; a gas injection system coupled to the processing chamber, and configured to alternatingly introduce a first process material and a second process material to the process space; a power source coupled to the processing chamber, and configured to couple power to the first process material, or the second process material, or both in the process space to facilitate the formation of plasma; and a temperature control system coupled to the substrate holder, and configured to control a temperature of the substrate.

According to yet another embodiment, a method of treating a substrate in a deposition system is described comprising: locating a substrate holder at a first position within a transfer space of a processing chamber of the deposition system; loading the substrate onto the substrate holder while the substrate holder is in the first position; locating the substrate holder within the processing chamber at a second position within a process space of the processing chamber; sealing the substrate holder with the processing chamber while the substrate holder is in the second position such that the process space is decoupled from the transfer space; evacuating the transfer space using a first pressure control system; evacuating the process space using a second pressure control system; treating the substrate in the process space by alternatingly exposing the substrate to a first process material and a second process material, and forming plasma during the exposing of the substrate to the second process material; relocating the substrate holder at the first position; and unloading the substrate when the substrate holder is at the first position. When relocating the substrate to the first position, the substrate holder is unsealed from the processing chamber and moved from the second position such that the process space is recoupled to the transfer space, and the pressure and flow within the processing chamber and transfer space are controlled to reduce the tendency of contaminant producing materials from entering the transfer space from the process chamber.

According to yet another embodiment, a deposition system for forming a thin film on a substrate is described comprising: a processing chamber comprising a process space in an upper region of the processing chamber configured to facilitate the thin film deposition, and a transfer space in a lower region of the processing chamber configured to facilitate transfer of the substrate into and out of the processing chamber; a substrate holder coupled to the processing chamber and configured to support the substrate, and configured to translate vertically between a first position to locate the substrate in the transfer space and a second position to locate the substrate in the process space, wherein the substrate holder comprises a sealing device configured to seal the substrate holder with the processing chamber when the substrate holder is in the second position; means for controlling the pressure in the transfer space in order to provide a substantially contaminant-free environment in the transfer space; means for controlling the pressure in the process space in order to evacuate the process space during processing; means for alternatingly introducing a first process material and a second process material to the process space; means for coupling power to the processing chamber in order to couple power to the first process material, or the second process material, or both in the process space to facilitate the formation of plasma; and means for controlling the temperature of the substrate.

BRIEF DESCRIPTION OF THE DRAWINGS

In the accompanying drawings.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
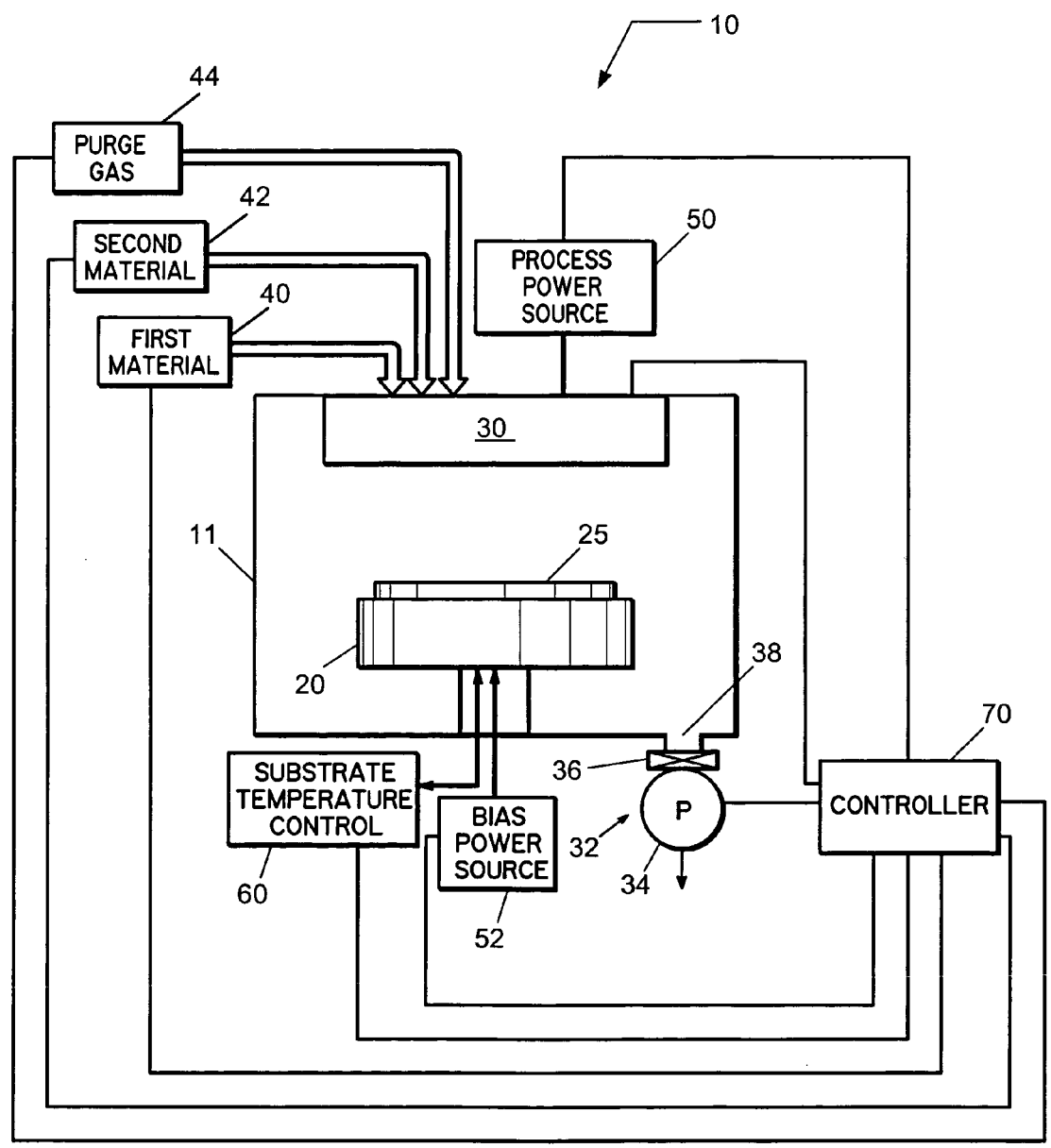
FIG. 1 is a schematic view depicting a deposition system.

Referring now to the drawings, wherein like reference numerals designate identical or corresponding parts throughout the several views, FIG. 1 illustrates a deposition system 10 for depositing a thin film, such as a barrier film, on a substrate using plasma enhanced atomic layer deposition (PEALD). For example, during the metallization of inter-connect and intra-connect structures for semiconductor devices in back-end-of-line (BEOL) operations, a thin conformal barrier layer may be deposited on wiring trenches or vias to minimize the migration of metal into the inter-level or intra-level dielectric, or a thin conformal seed layer may be deposited on wiring trenches or vias to provide a film with acceptable adhesion properties for bulk metal fill, or a thin conformal adhesion layer may be deposited on wiring trenches or vias to provide a film with acceptable adhesion properties for metal seed deposition. The deposition system 10 comprises a processing chamber 11 having a substrate holder 20 configured to support a substrate 25, upon which the thin film is formed. The processing chamber 11 further comprises an upper chamber assembly 30 coupled to a first process material supply system 40, a second process material supply system 42, and a purge gas supply system 44. Additionally, the deposition system 10 comprises a first power source 50 coupled to the processing chamber 11 and configured to generate plasma in the processing chamber 11, and a substrate temperature control system 60 coupled to substrate holder 20 and configured to elevate and control the temperature of substrate 25. Additionally, deposition system 10 comprises a controller 70 that can be coupled to processing chamber 11, substrate holder 20, upper assembly 30, first process material supply system 40, second process material supply system 42, purge gas supply system 44, first power source 50, and substrate temperature control system 60.

The deposition system 10 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to processing chamber 11, and they may be lifted to and from an upper surface of substrate holder 20 via substrate lift system (not shown).

The first process material supply system 40 and the second process material supply system 42 are configured to alternatingly introduce a first process material to processing chamber 11 and a second process material to processing chamber 11. The alternation of the introduction of the first process material and the introduction of the second process material can be cyclical, or it may be acyclical with variable time periods between introduction of the first and second process materials. The first process material can, for example, comprise a film precursor, such as a composition having the principal atomic or molecular species found in the film formed on substrate 25. For instance, the film precursor can originate as a solid phase, a liquid phase, or a gaseous phase, and it may be delivered to processing chamber 11 in a gaseous phase. The second process material can, for example, comprise a reducing agent. For instance, the reducing agent can originate as a solid phase, a liquid phase, or a gaseous phase, and it may be delivered to processing chamber 11 in a gaseous phase.

Additionally, the purge gas supply system 44 can be configured to introduce a purge gas to processing chamber 11 between introduction of the first process material and the second process material to processing chamber 11, respectively. The purge gas can comprise an inert gas, such as a Noble gas (i.e., helium, neon, argon, xenon, krypton).

Referring still to FIG. 1, the deposition system 10 comprises a plasma generation system configured to generate a plasma during at least a portion of the alternating introduction of the first process material and the second process material to processing chamber 11. The plasma generation system can include a first power source 50 coupled to the processing chamber 11, and configured to couple power to the first process material, or the second process material, or both in processing chamber 11. The first power source 50 may include a radio frequency (RF) generator and an impedance match network (not shown), and may further include an electrode (not shown) through which RF power is coupled to plasma in processing chamber 11. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the processing chamber, including the electrode, and plasma. For instance, the impedance match network serves to improve the transfer of RF power to plasma in plasma processing chamber 11 by reducing the reflected power. Match network topologies (e.g. L-type, π-type, T-type, etc.) and automatic control methods are well known to those skilled in the art.

Optionally, the deposition system 10 comprises a substrate bias generation system configured to generate a plasma during at least a portion of the alternating and cyclical introduction of the first process material and the second process material to processing chamber 11. The substrate bias system can include a second power source 52 coupled to the processing chamber 11, and configured to couple power to substrate 25. The second power source 52 may include a radio frequency (RF) generator and an impedance match network, and may further include an electrode through which RF power is coupled to substrate 25. The electrode can be formed in substrate holder 20. For instance, substrate holder 20 can be electrically biased at an RF voltage via the transmission of RF power from an RF generator (not shown) through an impedance match network (not shown) to substrate holder 20. A typical frequency for the RF bias can range from about 0.1 MHz to about 100 MHz. RF bias systems for plasma processing are well known to those skilled in the art. Alternately, RF power is applied to the substrate holder electrode at multiple frequencies.

Although the plasma generation system and the optional substrate bias system are illustrated in FIG. 1 as separate entities, they may comprise one or more power sources coupled to substrate holder 20.

Still referring to FIG. 1, deposition system 10 comprises substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermoelectric heaters/coolers can be included in the substrate holder 20, as well as the chamber wall of the processing chamber 11 and any other component within the deposition system 10.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the backside of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the processing chamber 11 is further coupled to a pressure control system 32, including a vacuum pumping system 34 and a valve 36, through a duct 38, wherein the pressure control system 34 is configured to controllably evacuate the processing chamber 11 to a pressure suitable for forming the thin film on substrate 25, and suitable for use of the first and second process materials.

The vacuum pumping system 34 can include a turbo-molecular vacuum pump (TMP) capable of a pumping speed up to about 5000 liters per second (and greater) and valve 36 can include a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 110. The pressure measuring device can be, for example, a Type 628B Baratron absolute capacitance manometer commercially available from MKS Instruments, Inc. (Andover, Mass.).

Still referring to FIG. 1, controller 70 can comprise a microprocessor, memory, and a digital I/O port capable of generating control voltages sufficient to communicate and activate inputs to deposition system 10 as well as monitor outputs from deposition system 10. Moreover, the controller 70 may exchange information with the processing chamber 11, substrate holder 20, upper assembly 30, first process material supply system 40, second process material supply system 42, purge gas supply system 44, first power source 50, second power source 52, substrate temperature control system 60, and pressure control system 32. For example, a program stored in the memory may be utilized to activate the inputs to the aforementioned components of the deposition system 10 according to a process recipe in order to perform an etching process, or a deposition process. One example of the controller 70 is a DELL PRECISION WORKSTATION 610, available from Dell Corporation, Austin, Tex.

Figure 2:
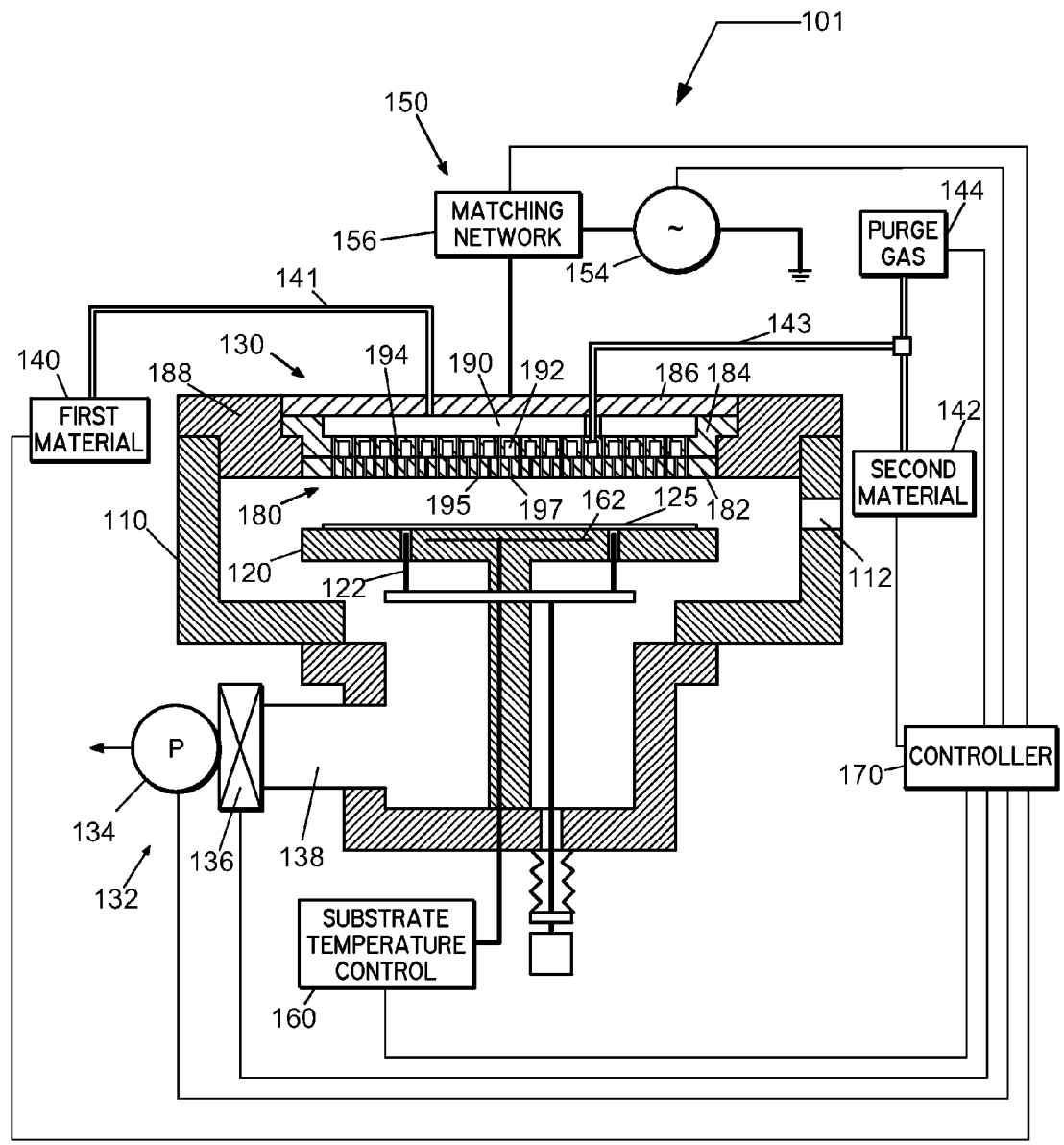
FIG. 2 is a schematic view depicting another deposition system.

Referring now to FIG. 2, another deposition system 101 is depicted. The deposition system 101 comprises a processing chamber 110 having a substrate holder 120 configured to support a substrate 125, upon which the thin film is formed. The processing chamber 110 further comprises an upper assembly 130 coupled to a first process material supply system 140, a second process material supply system 142, and a purge gas supply system 144. Additionally, the deposition system 101 comprises a first power source 150 coupled to the processing chamber 110 and configured to generate plasma in the processing chamber 110, and a substrate temperature control system 160 coupled to substrate holder 120 and configured to elevate and control the temperature of substrate 125. Additionally, deposition system 101 comprises a controller 170 that can be coupled to processing chamber 110, substrate holder 120, upper assembly 130, first process material supply system 140, second process material supply system 142, purge gas supply system 144, first power source 150, and substrate temperature control system 160.

The deposition system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to processing chamber 110 through passage 112, and they may be lifted to and from an upper surface of substrate holder 120 via substrate lift system 122. The passage 112 may be sealable with a gate valve (not shown).

The first process material supply system 140 and the second process material supply system 142 are configured to alternatingly introduce a first process material to processing chamber 110 and a second process material to processing chamber 110. The alternation of the introduction of the first process material and the introduction of the second process material can be cyclical, or it may be acyclical with variable time periods between introduction of the first and second process materials. The first process material can, for example, comprise a film precursor, such as a composition having the principal atomic or molecular species found in the film formed on substrate 125. For instance, the film precursor can originate as a solid phase, a liquid phase, or a gaseous phase, and it may be delivered to processing chamber 110 in a gaseous phase. The second process material can, for example, comprise a reducing agent. For instance, the reducing agent can originate as a solid phase, a liquid phase, or a gaseous phase, and it may be delivered to processing chamber 110 in a gaseous phase. In one example, during the deposition of tantalum (Ta) as a barrier layer, the first process material can include a solid film precursor, such as $TaCl_5$, and the second process material can include a reducing agent, such as hydrogen ($H_2$) gas. In another example, during the deposition of tantalum nitride (TaN) or tantalum carbonitride (TaCN) as a barrier layer, the first process material can include a metal organic film precursor, such as tertiary amyl imido-tris-dimethylamido tantalum ($Ta(NC(CH_3)_2C_2H_5)(N(CH_3)_2)_3$, hereinafter referred to as TAIMATA), and the second process material can include a reducing agent, such as hydrogen ($H_2$), ammonia ($NH_3$), silane ($SiH_4$), or disilane ($Si_2H_6$), or a combination thereof.

Additionally, the purge gas supply system 144 can be configured to introduce a purge gas to processing chamber 110 between introduction of the first process material and the second process material to processing chamber 110, respectively. The purge gas can comprise an inert gas, such as a Noble gas (i.e., helium, neon, argon, xenon, krypton).

The first material supply system 140, the second material supply system 142, and the purge gas supply system 144 can include one or more material sources, one or more pressure control devices, one or more flow control devices, one or more filters, one or more valves, or one or more flow sensors.

Referring still to FIG. 2, the first process material is coupled to processing chamber 110 through first material line 141, and the second process material is coupled to processing chamber 110 through second material line 143. Additionally, the purge gas may be coupled to processing chamber 110 through the first material line 141 (as shown), the second material line 143 (as shown), or an independent line, or any combination thereof. The first process material, second process material, and purge gas are introduced and distributed within processing chamber 110 through the upper assembly 130 that includes gas injection assembly 180. The gas injection assembly 180 may comprise a first injection plate 182, a second injection plate 184, and a third injection plate 186, which are electrically insulated from processing chamber 110 by insulation assembly 188. The first process material is coupled from the first process material supply system 140 to processing chamber 110 through a first array of through-holes 194 in the second injection plate 184 and a first array of orifices 195 in the first injection plate 182 via a first plenum 190 formed between the second injection plate 184 and the third injection plate 186. The second process material, or purge gas, or both is coupled from the second process material supply system 142 or purge gas supply system 144 to processing chamber 110 through a second array of orifices 197 in the first injection plate 182 via a second plenum 192 formed in the second injection plate 184.

Referring still to FIG. 2, the deposition system 101 comprises a plasma generation system configured to generate a plasma during at least a portion of the alternating and cyclical introduction of the first process material and the second process material to processing chamber 110. The plasma generation system can include a first power source 150 coupled to the processing chamber 110, and configured to couple power to the first process material, or the second process material, or both in processing chamber 110. The first power source 150 includes a radio frequency (RF) generator 154 and an impedance match network 156, and further includes an electrode, such as gas injection assembly 180, through which RF power is coupled to plasma in processing chamber 110. The electrode is formed in the upper assembly 130 and is insulated from processing chamber 110 via insulation assembly 188, and it can be configured to oppose the substrate holder 120. The RF frequency can, for example, range from approximately 100 kHz to approximately 100 MHz. Alternatively, the RF frequency can, for example, range from approximately 400 kHz to approximately 60 MHz. By way of further example, the RF frequency can, for example, be approximately 27.12 MHz.

Still referring to FIG. 2, deposition system 101 comprises substrate temperature control system 160 coupled to the substrate holder 120 and configured to elevate and control the temperature of substrate 125. Substrate temperature control system 160 comprises at least one temperature control element, including a resistive heating element such as an aluminum nitride heater. The substrate temperature control system 160 can, for example, be configured to elevate and control the substrate temperature up to approximately 400 degrees C. Alternatively, the substrate temperature can, for example, range from approximately 150 degrees C. to 350 degrees C.

Furthermore, the processing chamber 110 is further coupled to a pressure control system 132, including a vacuum pumping system 134 and a valve 136, through a duct 138, wherein the pressure control system 134 is configured to controllably evacuate the processing chamber 110 to a pressure suitable for forming the thin film on substrate 125, and suitable for use of the first and second process materials.

Figure 3:
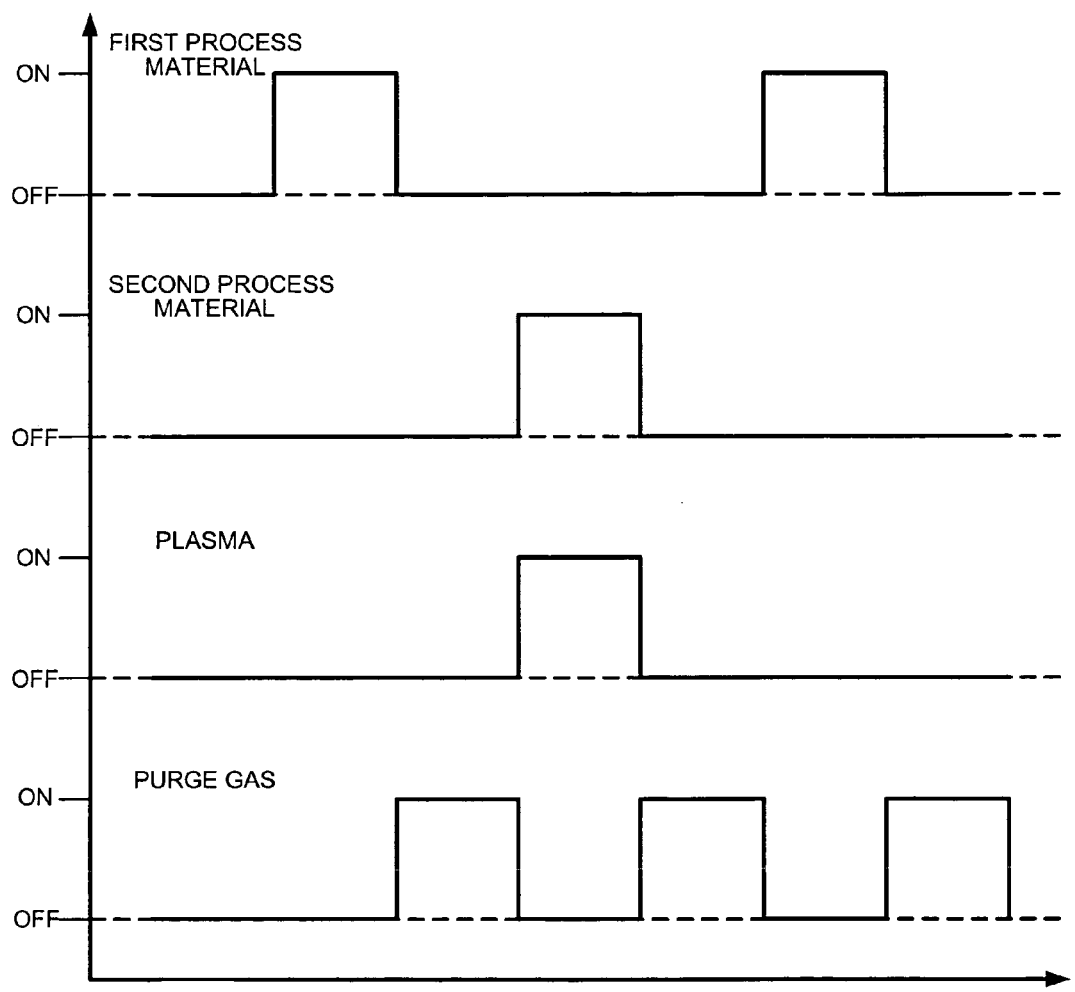
FIG. 3 is a timing diagram illustrating a method of depositing a thin film on a substrate.

Referring now to FIG. 3, deposition system 101 can be configured to perform a plasma enhanced atomic layer deposition (PEALD) process. For example, in a PEALD process for preparing a thin, conformal, tantalum-containing film, a first process material comprising tantalum, such as tantalum pentachloride or TAIMATA, is introduced to processing chamber 110 for a first period of time in order to cause adsorption of the film precursor (first process material) on exposed surfaces of substrate 125, then processing chamber 110 is purged with a purge gas for a second period of time. Thereafter, a reducing agent (second process material), such as hydrogen, is introduced to processing chamber 110 for a third period of time while power is coupled through the upper assembly 130 from the first power source 150 to the reducing agent. The coupling of power to the reducing agent heats the reducing agent, thus causing ionization and dissociation of the reducing agent in order to form, for example, atomic hydrogen, which chemically reacts with the first precursor adsorbed on substrate 125. When substrate 125 is heated to an elevated temperature, the surface chemical reaction facilitates the formation of the desired tantalum containing film. The processing chamber 110 is purged with a purge gas for a fourth period of time. The introduction of the first process material and the second process material, and the formation of plasma can be repeated any number of times to produce a film of desired thickness.

As described above in reference to FIGS. 1 and 2, a deposition system is described for performing a PEALD process as illustrated in FIG. 3. In the deposition system(s) described in FIGS. 1 and 2, the substrate is processed, as well as transferred into and out of the processing chamber in the same space. It has been observed by the inventors that following processing of the substrate, i.e., the deposition of a thin film, the substrate may encounter contamination during transfer out of the processing chamber. For example, when depositing tantalum (Ta), the first process material can include a halogen containing material, such as tantalum pentachloride, and the second process material can include hydrogen, whereby a hydrogen plasma is formed to generate hydrogen radical to reduce the adsorbed tantalum pentachloride on the substrate surface. During the process, chlorine can accumulate within internal surfaces of the processing chamber. Thereafter, following processing when the substrate is transferred out of the processing chamber, the film deposited on the substrate, already potentially containing residual chlorine, can become further contaminated with chlorine remaining in the processing chamber. The inventors have observed that chlorine-contaminated films lead to additional problems in the following process steps, such as copper agglomeration during metal seed formation for feature metallization.

Figure 4:
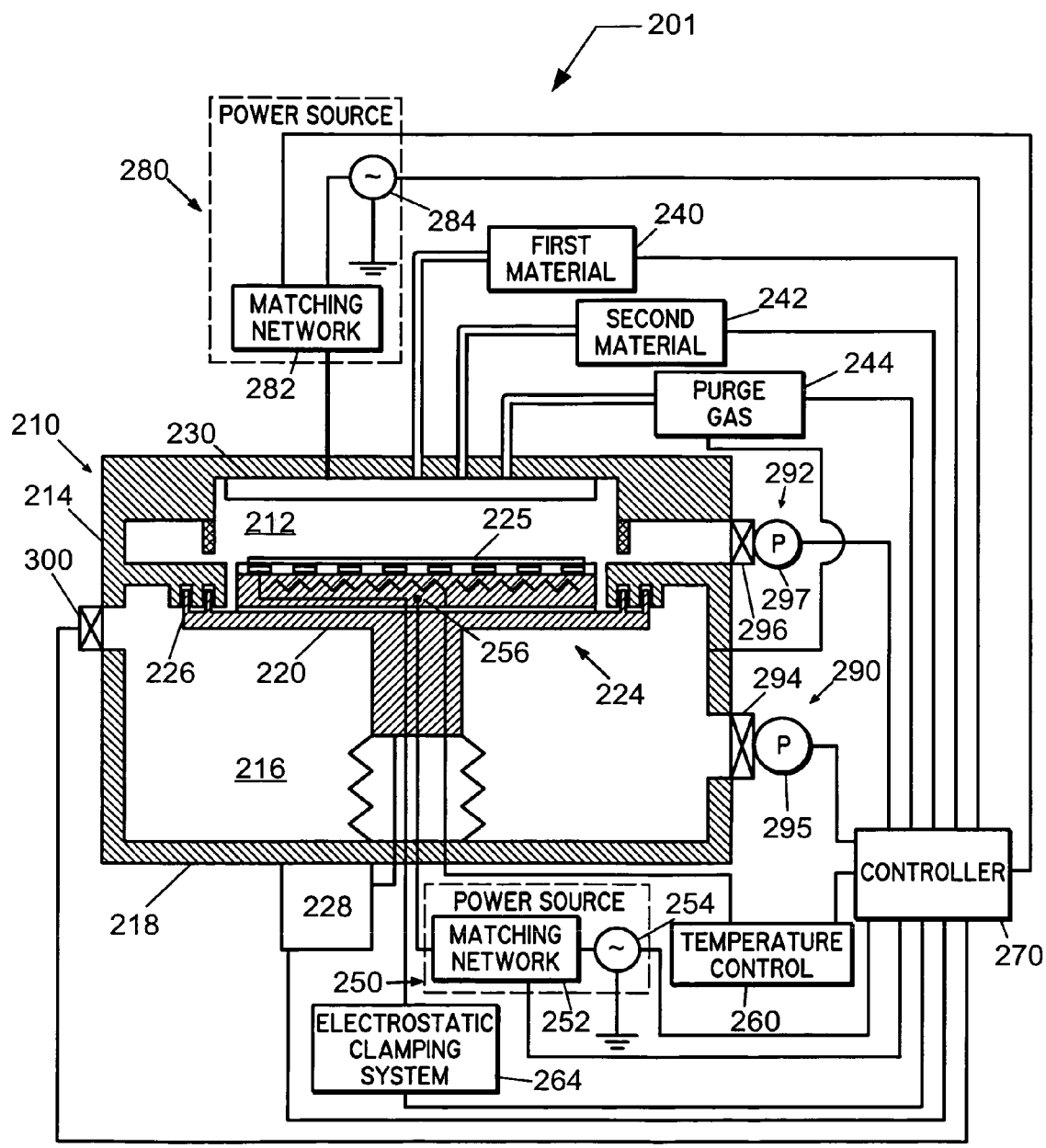
FIGS. 4 and 5 are schematic views depicting a deposition system according to an embodiment of the invention.

According to an embodiment, a deposition system 201 is provided in FIG. 4, which is configured to reduce substrate contamination during substrate treatment and transfer. The deposition system 201 comprises a processing chamber 210 having a process space 212 in an upper region 214 of processing chamber 210 configured to facilitate thin film deposition on a substrate 225, and a transfer space 216 in a lower region 218 of processing chamber 210 configured to facilitate transfer of substrate 225 into and out of processing chamber 210.

Figure 5:
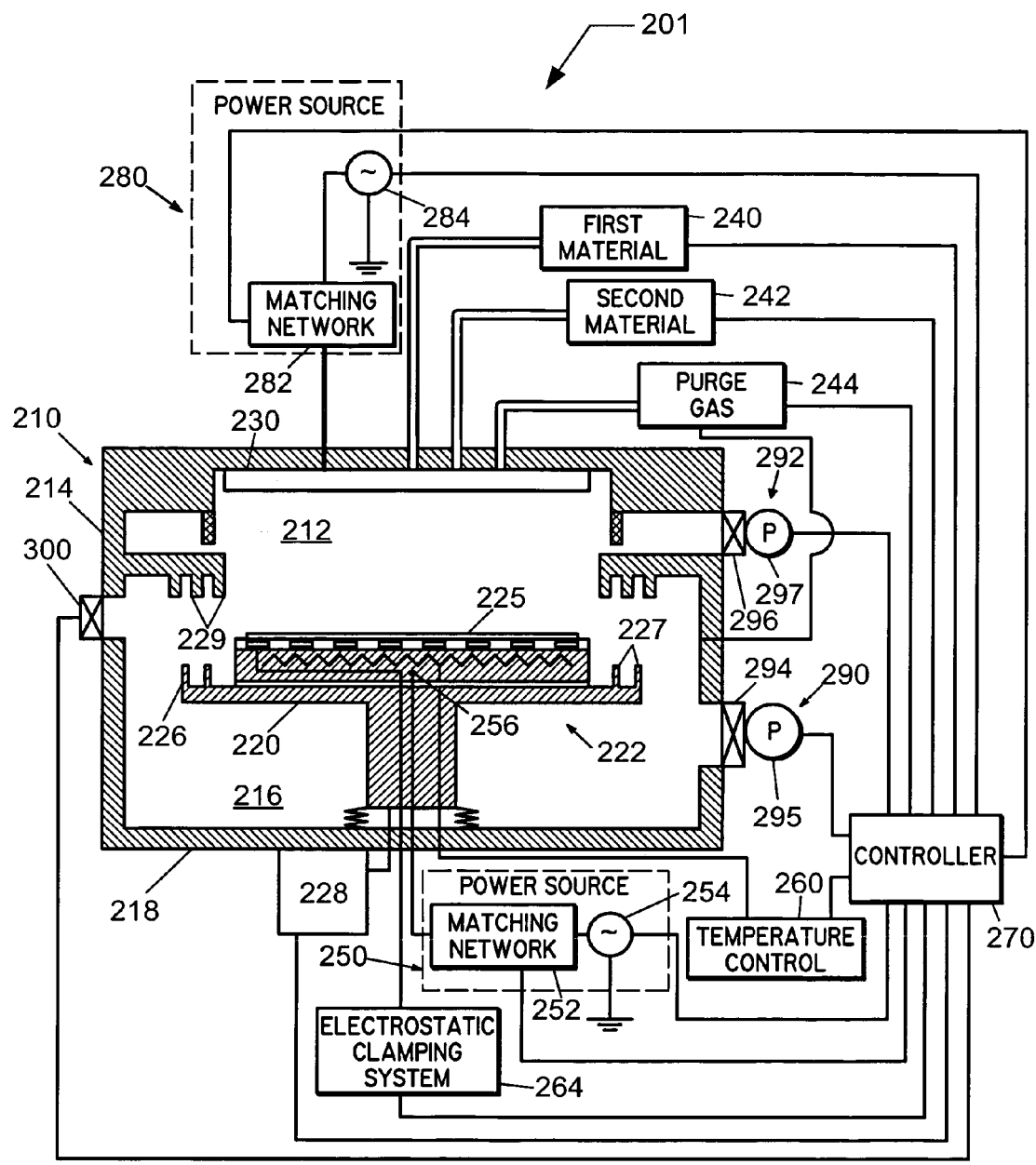

The deposition system 201 further comprises a substrate holder 220 coupled to processing chamber 210 and configured to support a substrate 225, upon which the thin film is formed. The substrate holder 220 is further configured to translate vertically between a first position 222 to locate the substrate 225 in the transfer space 216 (see FIG. 5) and a second position 224 to locate the substrate 225 in the process space 212 (see FIG. 4). The substrate holder 220 includes a sealing device 226 and a drive system 228. The sealing device is configured to seal the substrate holder 220 with the processing chamber 210 when the substrate holder 220 is in the second position 224. The drive system 228 is configured to translate the substrate holder 220. As illustrated in FIGS. 4 and 5, the sealing device 226 may comprise a labyrinth seal having a first set of teeth 227 coupled to an outer edge of the substrate holder 220 configured to mate with a second set of teeth 229 coupled to an inner edge of the upper region of the processing chamber 210 when the substrate holder 220 is located in the second position 224 such that the substrate 225 is in the process space 212. Alternatively, the sealing device 226 can comprise at least one (elastomer) O-ring seal coupled to the substrate holder 220, or the processing chamber 210, or both. Alternatively, other seals may be provided.

The processing chamber 210 further comprises an upper assembly 230 coupled to a first process material supply system 240, a second process material supply system 242, and a purge gas supply system 244. Additionally, the deposition system 201 comprises a first power source 250 coupled to the processing chamber 210 and configured to generate plasma in the processing chamber 210, and a substrate temperature control system 260 coupled to substrate holder 220 and configured to elevate and control the temperature of substrate 225. Additionally, deposition system 201 comprises a controller 270 that can be coupled to processing chamber 210, substrate holder 220, upper assembly 230, first process material supply system 240, second process material supply system 242, purge gas supply system 244, first power source 250, and substrate temperature control system 260.

Alternately, or in addition, controller 270 can be coupled to a one or more additional controllers/computers (not shown), and controller 270 can obtain setup and/or configuration information from an additional controller/computer.

In FIGS. 4 and 5, singular processing elements (210, 220, 230, 240, 242, 244, 250, and 260) are shown, but this is not required for the invention. The deposition system 201 can comprise any number of processing elements having any number of controllers associated with them in addition to independent processing elements.

The controller 270 can be used to configure any number of processing elements (210, 220, 230, 240, 242, 244, 250, and 260), and the controller 270 can collect, provide, process, store, and display data from processing elements. The controller 270 can comprise a number of applications for controlling one or more of the processing elements. For example, controller 270 can include a graphic user interface (GUI) component (not shown) that can provide easy to use interfaces that enable a user to monitor and/or control one or more processing elements.

The deposition system 201 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to processing chamber 210 through passage 212, and they may be lifted to and from an upper surface of substrate holder 220 via a substrate lift system.

The first process material supply system 240 and the second process material supply system 242 are configured to alternatingly introduce a first process material to processing chamber 210 and a second process material to processing chamber 210. The alternation of the introduction of the first process material and the introduction of the second process material can be cyclical, or it may be acyclical with variable time periods between introduction of the first and second process materials. The first process material can, for example, comprise a film precursor, such as a composition having the principal atomic or molecular species found in the film formed on substrate 225. For instance, the film precursor can originate as a solid phase, a liquid phase, or a gaseous phase, and it may be delivered to processing chamber 210 in a gaseous phase. The second process material can, for example, comprise a reducing agent. For instance, the reducing agent can originate as a solid phase, a liquid phase, or a gaseous phase, and it may be delivered to processing chamber 210 in a gaseous phase. In one example, during the deposition of tantalum (Ta) as a barrier layer, the first process material can include a solid film precursor, such as $TaCl_5$, and the second process material can include a reducing agent, such as hydrogen ($H_2$) gas. In another example, during the deposition of tantalum nitride (TaN) or tantalum carbonitride (TaCN) as a barrier layer, the first process material can include a metal organic film precursor, such as TAIMATA, and the second process material can include a reducing agent, such as hydrogen ($H_2$), ammonia ($NH_3$), silane ($SiH_4$), or disilane ($Si_2H_6$), or a combination thereof.

In another example, when depositing tantalum (Ta), tantalum nitride, or tantalum carbonitride, the first process material can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$, and the second process material can include $H_2$, $NH_3$, $N_2$ and $H_2$, $N_2H_4$, $NH(CH_3)_2$, or $N_2H_3CH_3$.

In another example, when depositing titanium (Ti), titanium nitride, or titanium carbonitride, the first process material can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT), and the second process material can include $H_2$, $NH_3$, $N_2$ and $H_2$, $N_2H_4$, $NH(CH_3)_2$, or $N_2H_3CH_3$.

As another example, when depositing tungsten (W), tungsten nitride, or tungsten carbonitride, the first process material can include $WF_6$, or $W(CO)_6$, and the second process material can include $H_2$, $NH_3$, $N_2$ and $H_2$, $N_2H_4$, $NH(CH_3)_2$, or $N_2H_3CH_3$.

Additionally, the purge gas supply system 244 can be configured to introduce a purge gas to processing chamber 210 between introduction of the first process material and the second process material to processing chamber 210, respectively. The purge gas can be introduced to either the transfer space 216, or the process space 212, or both. The purge gas can comprise an inert gas, such as a Noble gas (i.e., helium, neon, argon, xenon, krypton).

The first material supply system 240, the second material supply system 242, and the purge gas supply system 244 can include one or more material sources, one or more pressure control devices, one or more flow control devices, one or more filters, one or more valves, or one or more flow sensors.

Referring still to FIGS. 4 and 5, the deposition system 201 comprises a plasma generation system configured to generate plasma during at least a portion of the alternating and cyclical introduction of the first process material and the second process material to processing chamber 210. The plasma generation system can include a first power source 250 coupled to the processing chamber 210, and configured to couple power to the first process material, or the second process material, or both in processing chamber 210. For example, the first power source 250 may be coupled to the substrate holder 220 as depicted in FIGS. 4 and 5. The first power source 250 includes a radio frequency (RF) generator 254 and an impedance match network 252, and further includes an electrode 256, formed within substrate holder 220, through which RF power is coupled to plasma in processing chamber 210. The RF frequency can, for example, range from approximately 100 kHz to approximately 100 MHz. Alternatively, the RF frequency can, for example, range from approximately 400 kHz to approximately 60 MHz. By way of further example, the RF frequency can, for example, be approximately 27.12 MHz.

Alternatively, the plasma generation system can include a second power source 280 coupled to the processing chamber 210, and configured to couple power to the first process material, or the second process material, or both in processing chamber 210. For example, the second power source 280 may be coupled to the upper assembly 230 as depicted in FIGS. 4 and 5. The second power source 280 includes a radio frequency (RF) generator 284 and an impedance match network 282, and further includes an electrode 286, formed within upper assembly 230, through which RF power is coupled to plasma in processing chamber 210. The electrode is formed in the upper assembly 230 and is insulated from processing chamber 210 via an insulation assembly (not shown), and it can be configured to oppose the substrate holder 220.

Alternatively, the plasma generation system includes both the first power source 250 and the second power source 280, which can be utilized to generate plasma and bias substrate 225.

Alternatively, the second power source 280 may include a radio frequency (RF) generator and an impedance match network, and may further include an antenna, such as an inductive coil, through which RF power is coupled to plasma in processing chamber 210. The antenna can, for example, include a helical or solenoidal coil, such as in an inductively coupled plasma source or helicon source, or it can, for example, include a flat coil as in a transformer coupled plasma source.

Alternatively, the second power source 280 may include a microwave frequency generator, and may further include a microwave antenna and microwave window through which microwave power is coupled to plasma in processing chamber 210. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

Still referring to FIGS. 4 and 5, deposition system 201 comprises a substrate temperature control system 260 coupled to the substrate holder 220 and configured to elevate and control the temperature of substrate 225. Substrate temperature control system 260 comprises at least one temperature control element, including a resistive heating element such as an aluminum nitride heater. The substrate temperature control system 260 can, for example, be configured to elevate and control the substrate temperature up to approximately 400 degrees C. Alternatively, the substrate temperature can, for example, range from approximately 150 degrees C. to 350 degrees C.

In order to improve the thermal transfer between substrate 225 and substrate holder 220, substrate holder 220 can include a mechanical clamping system, or an electrical clamping system, such as an electrostatic clamping system 264, to affix substrate 225 to an upper surface of substrate holder 220. Furthermore, substrate holder 220 can further include a substrate backside gas delivery system (not shown) configured to introduce gas to the backside of substrate 225 in order to improve the gas-gap thermal conductance between substrate 225 and substrate holder 220. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 225.

Furthermore, the transfer space 216 of the lower region 218 in processing chamber 210 is coupled to a first pressure control system 290, and the process space 212 in the upper region 214 of processing chamber 210 is coupled to a second pressure control system 292. The first pressure control system 290 can comprise a first valve 294 and a first vacuum pumping system 295 configured to evacuate the transfer space 216 and control the pressure in transfer space 218. Additionally, the second pressure control system 292 can include a second valve 296 and a second vacuum pumping system 297 configured to controllably evacuate the processing chamber 210 to a pressure suitable for forming the thin film on substrate 225, and suitable for use of the first and second process materials. The first and second valves 294 and 296, respectively, can, for example, include gate valves. The first vacuum pumping system 295 can, for instance, comprise a cryogenic vacuum pump. The second vacuum pumping system 297 can, for instance, comprise a turbo-molecular vacuum pump (TMP) capable of a pumping speed up to about 5000 liters per second (and greater). In conventional plasma processing devices, a 1000 to 3000 liter per second TMP is generally employed. Moreover, a device for monitoring chamber pressure (not shown) in process space 212 can be coupled to the processing chamber 210. The pressure measuring device can be, for example, a Type 628B Baratron absolute capacitance manometer commercially available from MKS Instruments, Inc. (Andover, Mass.).

Referring still to FIGS. 4 and 5, the deposition system 201 further comprises a transfer gate 300 coupled to the lower region 218 of processing chamber 210. The transfer gate 300 can open and close in order to permit access to the transfer space 216 of the processing chamber 210 and allow the passing of substrate 225 into and out of the processing chamber 210. During the opening and closing of transfer gate 300, the processing chamber 210, or the transfer system to which the processing chamber is coupled, or both may be pressure controlled, purged with a gas, or differentially pumped, or any combination thereof.

Still referring to FIGS. 4 and 5, control system 270 can comprise a microprocessor, memory, and a digital I/O port capable of generating control voltages sufficient to communicate and activate inputs to deposition system 201 as well as monitor outputs from deposition system 201. Moreover, the controller 270 may be coupled to and may exchange information with the processing chamber 210, substrate holder 220, upper assembly 230, first process material supply system 240, second process material supply system 242, purge gas supply system 244, first power source 250, second power source 280, substrate temperature control system 260, first pressure control system 290, second pressure control system 292, and the transfer gate 300. For example, a program stored in the memory may be utilized to activate the inputs to the aforementioned components of the deposition system 201 according to a process recipe in order to perform an etching process, or a deposition process. One example of the controller 270 is a DELL PRECISION WORKSTATION 610, available from Dell Corporation, Austin, Tex.

The controller 270 may be locally located relative to the deposition system 201, or it may be remotely located relative to the deposition system 201. For example, the controller 270 may exchange data with the deposition 201 using at least one of a direct connection, an intranet, the Internet and a wireless connection. The controller 270 may be coupled to an intranet at, for example, a customer site (i.e., a device maker, etc.), or it may be coupled to an intranet at, for example, a vendor site (i.e., an equipment manufacturer). Additionally, for example, the controller 270 may be coupled to the Internet. Furthermore, another computer (i.e., controller, server, etc.) may access, for example, the controller 270 to exchange data via at least one of a direct connection, an intranet, and the Internet. As also would be appreciated by those skilled in the art, the controller 270 may exchange data with the deposition system 201 via a wireless connection.

Figure 6:
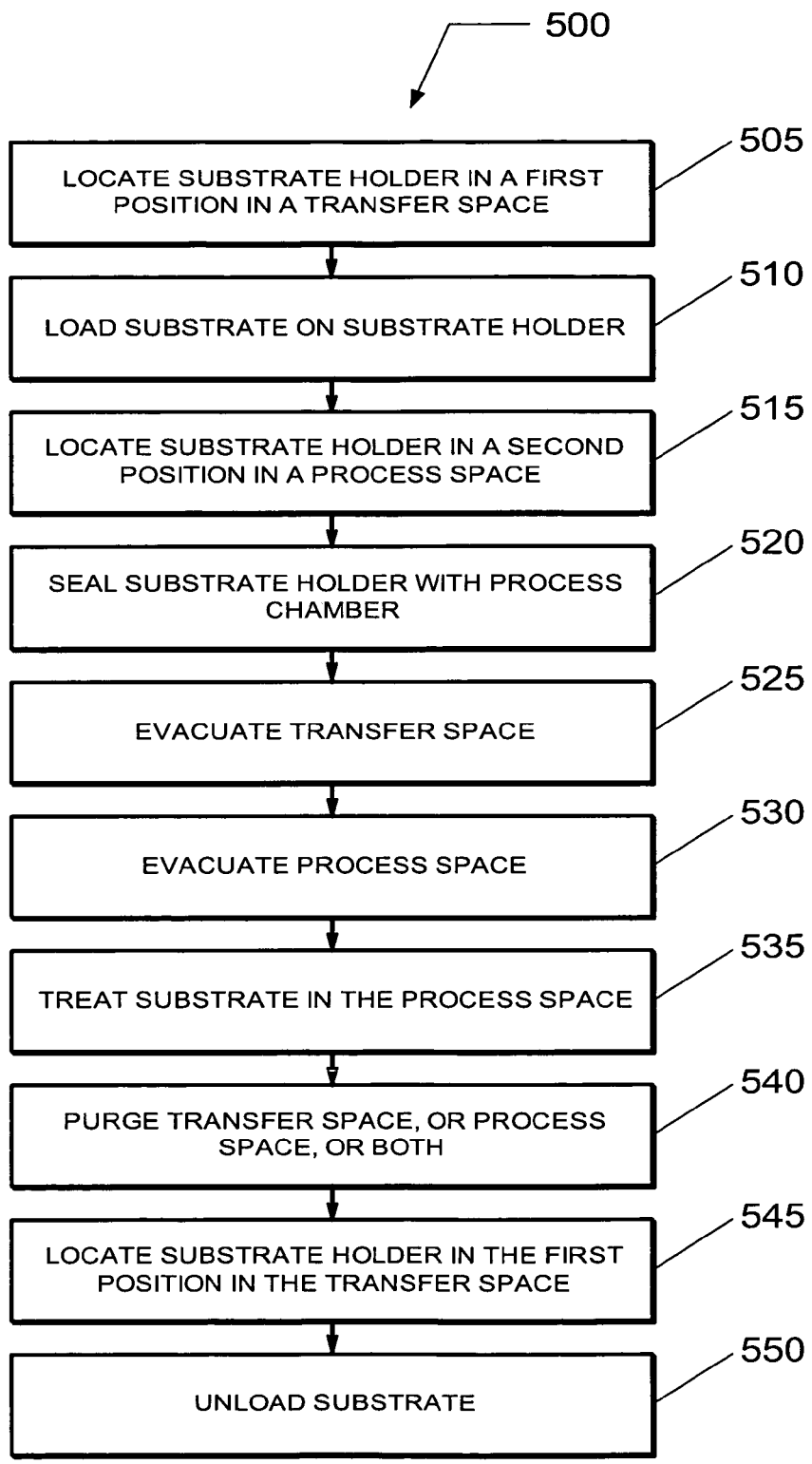
FIG. 6 is a flowchart illustrating a method of depositing a thin film on a substrate according to an embodiment of the invention.

According to yet another embodiment, a method of operating a deposition system, such as the system described in reference to FIGS. 4 and 5, is presented. FIG. 6 illustrates the method as a flowchart 500 beginning in 505 with locating a substrate holder in a processing chamber at a first position within the deposition system. The first position for the substrate holder is located within a transfer space formed in a lower region of the processing chamber such that the substrate can be passed into and out of the processing chamber. In 510, once the substrate holder is located in the first position within the transfer space, the substrate is passed into the processing chamber through a transfer gate, and loaded onto the substrate holder. When the substrate is loaded onto the substrate holder, the substrate may be clamped and a backside gas may be provided to the backside of the substrate.

Following the loading of the substrate, in 515, the substrate holder is located at a second position within the deposition system. The second position for the substrate holder is located within a process space formed in an upper region of the processing chamber that is configured to treat the substrate. In 520, when the substrate holder is located in the second position, the substrate holder forms a seal with the processing chamber such that the process space is decoupled from the transfer space. For example, the seal formed between the processing chamber and the substrate holder can include a labyrinth seal.

In 525, the transfer space is evacuated using a first pressure control system and, in 530, the process space is evacuated using a second pressure control system. The first pressure control system is configured to evacuate the transfer space of contaminants, operate at reduced pressure, and maintain a clean environment for substrate transfer. The second pressure control system is configured to evacuate the process space, operate a reduced pressure, and provide a pressure suitable for the treatment of the substrate.

In 535, the substrate is treated with a process. For example, the process can include a deposition process configured to form a thin film on the substrate using atomic layer deposition (ALD). In 540, once the process for treating the substrate is complete, the process space may be purged, the transfer space may be purged, or both spaces may be purged. In 545, the substrate holder is located in the first position within the transfer space. During the translation of the substrate holder from the second position to the first position, the process space, or the transfer space, or both may be purged with a purge gas, such as an inert gas.

In 550, the substrate is unloaded from the substrate holder and passed out of the processing chamber.

Figure 6A:
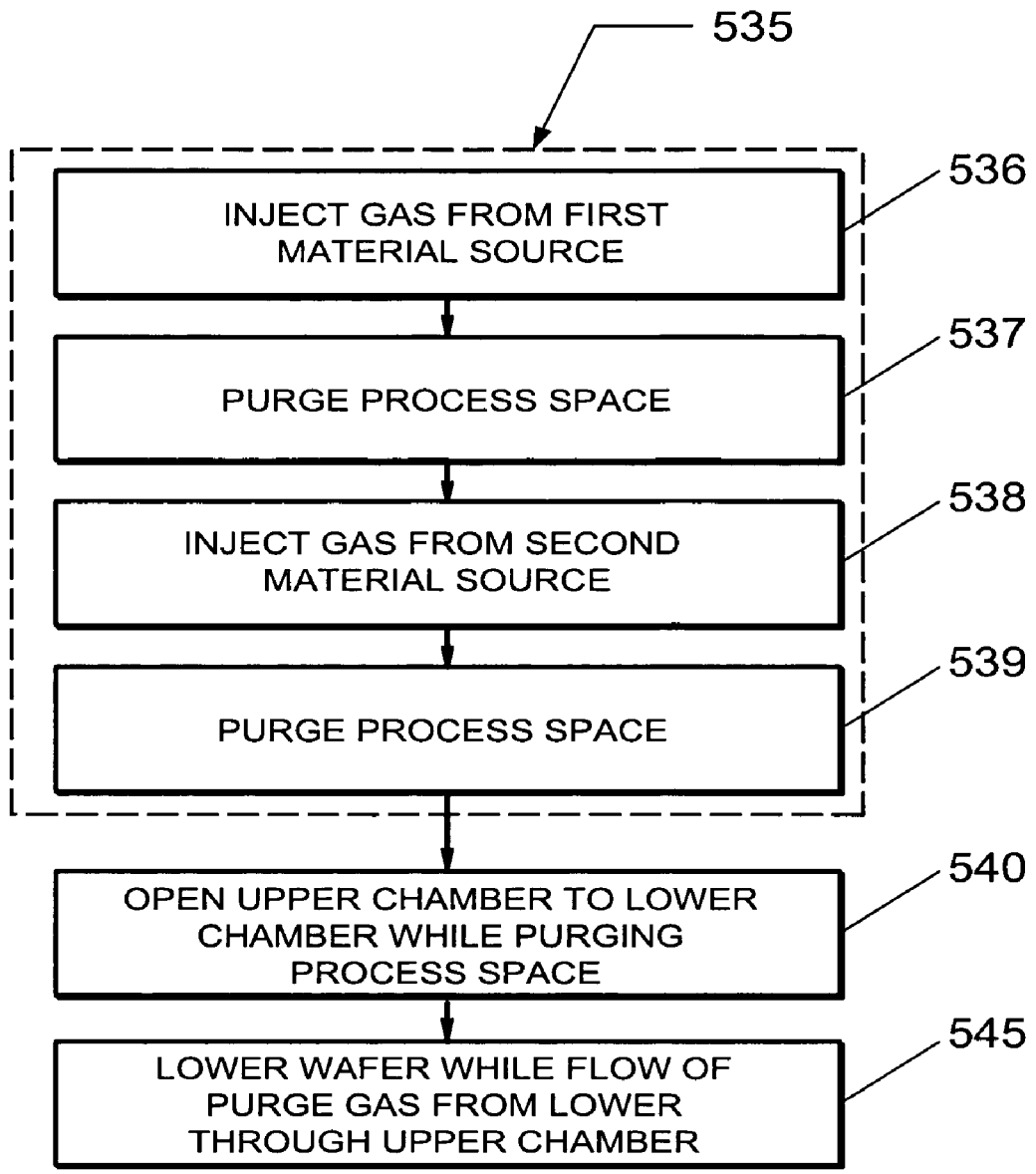
FIG. 6A is an enlargement of a portion of the flowchart of FIG. 6.

FIG. 6A illustrates in more detail an embodiment of steps 535, 540 and 545 of FIG. 6. In step 535, for example, the treating of the substrate in the process space may include, as in 536, injecting gas from the first material source into the process space. This gas may be $TaCl_5$ gas which adsorbs onto the surface of the substrate. Then, this first material may be purged, as in 537. Then, as in step 538, gas may be injected from the second material source into the process space. This gas may be $H_2$ gas which reacts with the adsorbed $TaCl_5$ on the surface of the substrate, releasing the Cl. Then the process space may again be purged, as in 539. Steps 536 through 539 may be repeated, each time a mono-atomic layer (or fraction thereof) of coating, for example Ta, being deposited on the substrate. Then, in 540, the upper chamber containing the process space is opened to the lower chamber while purge of the process space continues, so as to minimize progression of process gas to the lower chamber. Then, in 545, the substrate is lowered into the lower chamber where additional purging may continue.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. An atomic layer deposition system for forming a thin film on a substrate comprising:

a processing chamber comprising a process space in an upper region of said processing chamber configured to facilitate said thin film deposition, and a transfer space in a lower region of said processing chamber having an opening to the upper region at the top thereof, the lower region being configured to facilitate transfer of said substrate into and out of the upper region of said processing chamber;

a substrate holder coupled to said processing chamber and configured to support said substrate and to translate vertically between a first position to locate said substrate in said transfer space and a second position to locate said substrate in said process space, said substrate holder comprising a sealing device configured to seal said substrate holder with said processing chamber to seal the opening and to isolate the transfer space from the process space when said substrate holder is in said second position;
at least two pressure control systems, including:
a first pressure control system coupled to said transfer space and configured to provide a substantially contaminant-free environment in said transfer space when isolated from said process space by the sealing member of the substrate holder when in said second position;
a second pressure control system coupled to said process space and configured to evacuate said process space during processing;
a gas injection system coupled to the upper region of said processing chamber, and configured to alternatingly introduce a first process material and a second process material to said process space;
a power source coupled to said processing chamber, and configured to couple power to said first process material, or said second process material, or both in said process space to facilitate the formation of plasma;
a temperature control system coupled to said substrate holder, and configured to control a temperature of said substrate; and
a process controller operable to control the deposition system to perform a plasma-enhanced atomic layer deposition process on the substrate.

2. The deposition system of claim 1, wherein said deposition system is coupled to a transfer system configured to transport said substrate into said transfer space of said processing chamber through a gate valve coupled to said lower region of said processing chamber.

3. The deposition system of claim 1, wherein said sealing device comprises a labyrinth seal formed between an outer edge of said substrate holder and an inner edge of said upper region of said processing chamber.

4. The deposition system of claim 3, wherein said labyrinth seal comprises a first set of teeth coupled to said substrate holder and configured to mate with a second set of teeth coupled to said processing chamber when said substrate holder is located in said second position.

5. The deposition system of claim 1, wherein said sealing device comprises at least one O-ring seal coupled to said substrate holder, or said processing chamber, or both.

6. The deposition system of claim 1, wherein said substrate holder further comprises a clamping system configured to affix said substrate to said substrate holder.

7. The deposition system of claim 6, wherein said clamping system comprises a mechanical clamping system or an electrical clamping system.

8. The deposition system of claim 1, wherein said substrate holder further comprises a backside gas distribution system configured to supply a heat transfer gas to the backside of said substrate to improve the thermal conduction between said substrate and said substrate holder.

9. The deposition system of claim 1, wherein said first pressure control system comprises a first pumping system and a first valve, and said second pressure control system comprises a second pumping system and a second valve.

10. The deposition system of claim 1, wherein said first pressure control system comprises a cryogenic vacuum pumping system.

11. The deposition system of claim 1, wherein said second pressure control system comprises a turbomolecular vacuum pumping system.

12. The deposition system of claim 1, wherein said gas injection system is configured to alternatingly and cyclically introduce a tantalum containing halogen and a hydrogen containing gas.

13. The deposition system of claim 1, wherein said gas injection system is configured to alternatingly and cyclically introduce tantalum pentachloride and hydrogen.

14. The deposition system of claim 1, wherein said power source is configured to couple power to said second process material.

15. The deposition system of claim 1, wherein said power source is coupled to an electrode within said substrate holder.

16. The deposition system of claim 15, wherein said power source comprises a radio frequency (RF) generator and an impedance match network.

17. The deposition system of claim 1, further comprising:
an upper assembly coupled to said processing chamber, wherein said gas injection system is coupled to said upper assembly and said upper assembly opposes said substrate across said process space.

18. The deposition system of claim 17, wherein said power source is coupled to an electrode formed within said upper assembly.

19. The deposition system of claim 18, wherein a second power source is coupled to said substrate holder.

20. The deposition system of claim 1, further comprising:
a controller coupled to said processing chamber, said substrate holder, said power source, said first and second pressure controls and said gas injection system, and configured to perform at least one of monitoring, adjusting, or controlling said processing of said substrate in said process space.

21. A deposition system for forming a thin film on a substrate comprising:
a processing chamber comprising a process space in an upper region of said processing chamber configured to facilitate said thin film deposition, and a transfer space in a lower region of said processing chamber having an opening to the upper region at the top thereof, the lower region being configured to facilitate transfer of said substrate into and out of the upper region of said processing chamber;
a substrate holder coupled to said processing chamber and configured to support said substrate and to translate vertically between a first position to locate said substrate in said transfer space and a second position to locate said substrate in said process space, said substrate holder comprising a sealing device configured to seal said substrate holder with said processing chamber to seal the opening and to isolate the transfer space from the process space when said substrate holder is in said second position;
means for controlling the pressure in said transfer space in order to provide a substantially contaminant-free environment in said transfer space;
means for controlling the pressure in said process space in order to evacuate said process space during processing;
means for alternatingly introducing a first process material and a second process material to said process space;
means for coupling power to said processing chamber in order to couple power to said first process material, or said second process material, or both in said process space to facilitate the formation of plasma; and
means for controlling the temperature of said substrate.

* * * * *